(12) United States Patent
Kodama

(10) Patent No.: US 8,859,071 B2
(45) Date of Patent: Oct. 14, 2014

(54) CURABLE COMPOSITION FOR IMPRINT, PATTERNING METHOD AND PATTERN

(75) Inventor: Kunihiko Kodama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 952 days.

(21) Appl. No.: 12/991,082

(22) PCT Filed: Mar. 8, 2010

(86) PCT No.: PCT/JP2010/054270
§ 371 (c)(1),
(2), (4) Date: Nov. 4, 2010

(87) PCT Pub. No.: WO2010/104188
PCT Pub. Date: Sep. 16, 2010

(65) Prior Publication Data
US 2011/0059302 A1    Mar. 10, 2011

(30) Foreign Application Priority Data
Mar. 9, 2009  (JP) .................... 2009-055535

(51) Int. Cl.
| | | |
|---|---|---|
| *B32B 3/00* | (2006.01) | |
| *C08F 22/10* | (2006.01) | |
| *C08F 20/38* | (2006.01) | |
| *C08F 22/24* | (2006.01) | |
| *C08F 22/18* | (2006.01) | |
| *G03F 7/027* | (2006.01) | |
| *B82Y 40/00* | (2011.01) | |
| *G03F 7/004* | (2006.01) | |
| *B82Y 10/00* | (2011.01) | |
| *C08F 20/22* | (2006.01) | |
| *G03F 7/00* | (2006.01) | |

(52) U.S. Cl.
CPC .............. *C08F 20/22* (2013.01); *C08F 22/105* (2013.01); *C08F 20/38* (2013.01); *C08F 22/24* (2013.01); *C08F 22/18* (2013.01); *G03F 7/027* (2013.01); *B82Y 40/00* (2013.01); *G03F 7/0046* (2013.01); *B82Y 10/00* (2013.01); *G03F 7/0002* (2013.01)
USPC .......... 428/64.2; 428/156; 428/421; 522/180; 522/182; 522/183; 526/243

(58) Field of Classification Search
CPC .......... C08F 20/22; C08F 20/24; C08F 20/38; C08F 22/24; C08F 22/105

USPC .................... 428/64.2, 64.4, 195.1, 156, 421; 522/180, 182, 183; 526/243, 247
See application file for complete search history.

(56) References Cited

U.S. PATENT DOCUMENTS

| | | | |
|---|---|---|---|
| 3,883,596 A * | 5/1975 | Hager et al. ................... 568/55 |
| 5,259,926 A | 11/1993 | Kuwabara et al. | |
| 5,739,380 A * | 4/1998 | Lui et al. ...................... 560/220 |
| 5,772,905 A | 6/1998 | Chou | |
| 5,956,216 A | 9/1999 | Chou | |
| 7,132,214 B2 * | 11/2006 | Taylor et al. ............... 430/270.1 |
| 2006/0105269 A1 | 5/2006 | Khojasteh et al. | |
| 2008/0107870 A1 | 5/2008 | Kawaguchi et al. | |
| 2008/0167396 A1 | 7/2008 | Murao | |

FOREIGN PATENT DOCUMENTS

| | | |
|---|---|---|
| EP | 1873174 A1 | 1/2008 |
| JP | 2004-240241 A | 8/2004 |
| JP | 2005-197699 A | 7/2005 |
| JP | 2005-301289 A | 10/2005 |
| JP | 2006-114882 A | 4/2006 |
| JP | 2008-095037 A | 4/2008 |
| WO | 2006/114958 A1 | 11/2006 |

OTHER PUBLICATIONS

International Preliminary Report on Patentability, mailed Sep. 22, 2011, on International Application PCT/JP2010/054270.
Extended European Search Report dated Jan. 31, 2012 on EP Application No. 10750937.4.
Stephen Y. Chou, et al., "Imprint of sub-25 nm vias and trenches in polymers," Appl. Phys. Lett., Nov. 20, 1995, pp. 3114-3116, vol. 67, No. 21.
M. Colburn, et al., "Step and Flash Imprint Lithography: A New Approach to High-Resolution Patterning," Mar. 1999, pp. 379-389, SPIE, Part of the SPIE Conference on Emerging Lithographic Technologies III, SPIE vol. 3676.
Office Action dated Jan. 7, 2014 in European Application No. 10 750 937.4.

* cited by examiner

*Primary Examiner* — Gerard Higgins
(74) *Attorney, Agent, or Firm* — Sughrue Mion, PLLC

(57) ABSTRACT

A curable composition for imprints, which is excellent in patternability and in line edge roughness, is provided. The curable composition for imprints comprises at least one kind of polymerizable monomer (A) and at least one kind of photopolymerization initiator (B). The polymerizable monomer (A) comprises at least two fluorine-containing groups selected from a fluoroalkyl group and a fluoroalkylether group and each of two of the fluorine-containing groups is connected with each other through a linking group having at least two carbon atoms.

17 Claims, No Drawings

CURABLE COMPOSITION FOR IMPRINT, PATTERNING METHOD AND PATTERN

CROSS REFERENCE TO RELATED APPLICATIONS

This application is a National Stage of International Application No. PCT/JP2010/054270 filed Mar. 8, 2010, claiming priority based on Japanese Patent Application No. 2009-055535 filed Mar. 9, 2009, the contents of all of which are incorporated herein by reference in their entirety.

TECHNICAL FIELD

The present invention relates to a curable composition for imprints. More precisely, the invention relates to a curable composition for patterning through photoirradiation to give imprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

BACKGROUND ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photocurable composition (for example, see M. Colbun, et al., Proc. SPIE, Vol. 3676, 379 (1999)). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956, 216 disclose a nanoimprint method of forming nanopatterns inexpensively.

On the other hand, in the photonanoimprint method where a curable composition for photonanoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the nanoimprint methods as above, proposed are applied technologies mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned nanoimprint technologies and their applied technologies has become active for practical use thereof.

As one example of nanoimprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of nanoimprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of nanoimprint technology is proposed. The application also requires micropatternability on a level of a few tens nm and high-level etching resistance of the micropattern functioning as a mask in substrate processing.

Next described is an application example of nanoimprint technology to flat displays such as liquid-crystal displays (LCD) and plasma display panels (PDP).

With the recent tendency toward large-sized LCD substrates and PDP substrates for high-definition microprocessing thereon, photonanoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photonanoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 μm or 20 μm or so is formed through photolithography, and this is further thermally cured through past-baking to form the intended spacer.

Further, nanoimprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in nanoimprint technology, which is therefore specifically noted as a technology capable of forming micropatterns inexpensively.

When nanoimprint technology is used in industry, properties according to the use as described above as well as good patternability are required. For example, in the use for manufacturing a substrate, excellent etching resistance and pattern accuracy after etching are required.

JP-A-2006-114882 and JP-A-2008-95037 disclose that a photo curable composition comprising a fluorine-containing monomer is excellent in patternability when used in nanoimprints. However, even when those compositions are used, there occur problems of deterioration of patternability and of adhesion of composition to the mold in the case where pattern transfer is repeated.

SUMMARY

It is an object of the invention to provide a curable composition for imprints, which is excellent in patternability, and which is excellent in line edge roughness in the pattern after etching in the case where the composition is used for manufacturing a substrate, and to provide a patterning method using the same and a pattern obtained by the pattering method.

Given the situation as above, the present inventor has assiduously studied and has found that the present problem has solved by the following means;

(1) A curable composition for imprints comprising at least one kind of polymerizable monomer (A) and at least one kind of photopolymerization initiator (B), wherein the polymerizable monomer (A) comprises at least two fluorine-containing groups selected from a fluoroalkyl group and a fluoroalkylether group, and each of two of the fluorine-containing groups is connected with each other through a linking group having at least two carbon atoms.

(2) The curable composition for imprints according to (1), wherein at least one of the fluorine-containing groups connected with each other through a linking group having at least two carbon atoms is a fluoroalkyl group having at least two carbon atoms.

(3) The curable composition for imprints according to (1), wherein at least one of the fluorine-containing groups connected with each other through a linking group having at least two carbon atoms is a fluoroalkyl group having at least four carbon atoms.

(4) The curable composition for imprints according to any one of (1) to (3), wherein at least one of the fluorine-containing groups connected with each other through a linking group having at least two carbon atoms comprises a trifluoromethyl group.

(5) The curable composition for imprints according to any one of (1) to (4), wherein the linking group having at least two carbon atoms comprises at least one group selected from an alkylene group, an ester group, a sulfide group, an arylene group, an amide group and an urethane group.

(6) The curable composition for imprints according to any one of (1) to (5), wherein the polymerizable monomer (A) comprises a linking group comprising a sulfide bond.

(7) The curable composition for imprints according to any one of (1) to (6), wherein the polymerizable monomer (A) comprises at least two polymerizable groups.

(8) The curable composition for imprints according to any one of (1) to (7), wherein the polymerizable monomer (A) is represented by the following formula (A1);

wherein Rf is a functional group comprising a fluorine-containing groups selected from a fluoroalkyl group and a fluoroalkylether group; $A^1$ represents a linking group; Y represents a polymerizable functional group; x represents an integer of 1 to 4.

(9) The curable composition for imprints according to any one of (1) to (8), wherein the polymerizable monomer (A) is a (meth)acrylate.

(10) The curable composition for imprints according to any one of (1) to (9), which further comprises a polymerizable monomer other than the polymerizable monomer (A).

(11) The curable composition for imprints according to (10), wherein the polymerizable monomer other than the polymerizable monomer (A) is a (meth)acrylate monomer comprising an aromatic structure and/or an alicyclic hydrocarbon structure.

(12) The curable composition for imprints according to any one of (1) to (11), wherein the content of a compound having a molecular weight of 2000 or more is 30% by mass or less, relative to the total amount of all polymerizable monomers in the curable composition for imprints.

(13) The curable composition for imprints according to any one of (1) to (12), which further comprises at least one of a surfactant and an antioxidant.

(14) The curable composition for imprints according to any one of (1) to (13), wherein the polymerizable monomer (A) comprises a partial structure represented by the following formula (I);

wherein n represents an integer of 1 to 8.

(15) The curable composition for imprints according to any one of (1) to (13), wherein the polymerizable monomer (A) comprises a partial structure represented by the following formula (II);

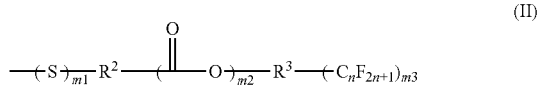

wherein $R^2$ and $R^3$ each represent an alkylene group having 1 to 8 carbon atoms; m1 and m2 each represent 0 or 1, provided that at least one of m1 and m2 is 1; m3 represents an integer of 1 to 3; and n represents an integer of 1 to 8.

(16) The curable composition for imprints according to any one of (1) to (13), wherein the polymerizable monomer (A) is represented by the following formula (III);

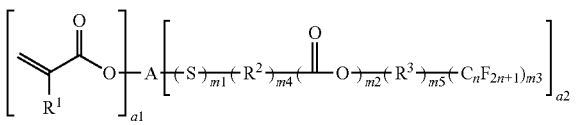

wherein $R^1$ represents a hydrogen atom, an alkyl group, a halogen atom, or a cyano group; A is a (a1+a2)-valent linking group; a1 represents an integer of 1 to 6; a2 represents an integer of 2 to 6; $R^2$ and $R^3$ are each an alkylene group having 1 to 8 carbon atoms; m1 and m2 each represents 0 or 1, provided that at least one of m1 and m2 is 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

(17) A patterning method, comprising using the curable composition according to any one of (1) to (16).

(18) A patterning method, comprising applying the curable composition for imprints according to any one of (1) to (16) onto a substrate to form a patterning layer thereon, pressing a mold against a surface of the patterning layer, and irradiating the patterning layer with light.

(19) A pattern obtained according to the patterning method according to (17) or (18).

(20) A polymerizable monomer represented by the following formula (III);

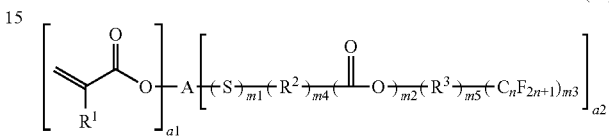

wherein $R^1$ represents a hydrogen atom, an alkyl group, a halogen atom, or a cyano group; A is a (a1+a2)-valent linking group; a1 represents an integer of 1 to 6; a2 represents an integer of 2 to 6; $R^2$ and $R^3$ are each an alkylene group having 1 to 8 carbon atoms; m1 and m2 each represents 0 or 1, provided that at least one of m1 and m2 is 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

(21) A polymerizable composition comprising a polymerizable monomer represented by the following formula (III);

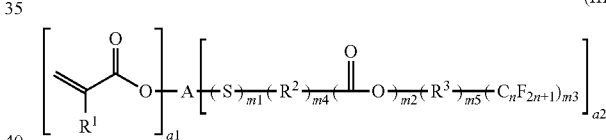

wherein $R^1$ represents a hydrogen atom, an alkyl group, a halogen atom, or a cyano group; A is a (a1+a2)-valent linking group; a1 represents an integer of 1 to 6; a2 represents an integer of 2 to 6; $R^2$ and $R^3$ are each an alkylene group having 1 to 8 carbon atoms; m1 and m2 each represents 0 or 1, provided that at least one of m1 and m2 is 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

The invention can provide to a curable composition for imprints, which is excellent in patternability and which is excellent in line edge roughness in the pattern after etching in the case where the composition is used for manufacturing a substrate.

DETAILED DESCRIPTION OF INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl.

In the invention, monomer is differentiated from oligomer and polymer, and the monomer indicates a compound having a weight-average molecular weight of at most 1,000. In this description, "functional group" means a group participating in polymerization.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Imprints of the Invention]

The curable composition for imprints of the invention (hereinafter, simply referred to as "the curable composition of the invention" or "the composition of the invention") comprises at least one kind of polymerizable monomer and a photopolymerization initiator, wherein one kind of the polymerizable monomer is the polymerizable monomer (A).

(Polymerizable Monomer)
(A) Polymerizable Monomer

The polymerizable monomer (A) is a compound comprising at least two fluorine-containing groups selected from a fluoroalkyl group and a fluoroalkylether group, wherein each of two of the fluorine-containing groups is connected with each other through a linking group having at least two carbon atoms.

The fluoroalkyl group is preferably a fluoroalkyl group having two or more carbon atoms, more preferably a fluoroalkyl group having four or more carbon atoms. While the upper limit of number of the carbon atoms is not specifically limited, it is preferably 20 or less, more preferably 8 or less, further more preferably 6 or less. Even more preferably, the fluoroalkyl group is a fluoroalkyl group having 4 to 6 carbon atoms. At least two of the fluoroalkyl groups preferably comprise a trifluoromethyl group. The inclusion of plural trifluoromethyl groups easily exerts the effect of the invention even if the amount to be added is less (for example, 10% by mass or less), and thereby enhancing compatibility with other ingredients and enhancing line edge roughness after dry etching.

In view of a similar point, a polymerizable monomer (A) having three or more trifluoromethyl groups therein is preferable. The polymerizable monomer (A) is more preferably a compound having 3 to 9 trifluoromethyl groups, furthermore preferably a compound having 4 to 6 trifluoromethyl groups. The compound having three or more trifluoromethyl groups is preferably a compound having a branched fluoroalkyl group, which has two or more trifluoromethyl groups in one fluorine-containing group, such as —CH(CF$_3$)$_2$ group, —C(CF$_3$)$_3$ group, —CCH$_3$(CF$_3$)$_2$CH$_3$ group.

The fluoroalkylether group is preferably a group comprising a trifluoromethyl group, more preferably a group comprising a perfluoroethyleneoxy group, or a group comprising a perfluoroprolyleneoxy group. Preferred are a group comprising a fluoroalkylene unit comprising a trifluoromethyl group, such as —(CF(CF$_3$)CF$_2$O)— and/or a fluoroalkylether group comprising a trifluoromethyl group at a terminal thereof.

The polymerizable monomer (A) preferably has 6 to 60 fluorine atoms, more preferably 9 to 40 fluorine atoms, further more preferably 12 to 40.

Content percentage of the fluorine atoms is the polymerizable monomer (A) defined below is preferably 30 to 60%, more preferably 35 to 55%, further more preferably 35 to 50%. By adjusting the content percentage of the fluorine atoms to appropriate range, the mold is less dirtied and line edge roughness after dry-etching is enhanced. The content percentage of the fluorine atoms are represented by the following formula;

Content percentage of fluorine atoms(%)=[(Number of fluorine atoms in the polymerizable monomer (A))×(atomic weight of fluorine atom)]/(molecular weight of the polymerizable monomer(A))× 100

At least two of fluorine-containing groups in the polymerizable monomer (A) are separated by a linking group having two or more carbon atoms. When the polymerizable monomer (A) has two fluorine-containing groups, the two fluorine-containing groups are separated by a linking group having two or more carbon atoms. When the polymerizable monomer (A) has three fluorine-containing groups, at least two of the three fluorine-containing groups are separated by a linking group having two or more carbon atoms, and the other fluorine-containing groups may bond at any position.

The functional group contained in the linking group having two or more carbon atoms is exemplified by a group comprising at least one group selected from an alkylene group, an ester group, a sulfide group, an arylene group, an amide group, and an urethane group, and preferably contains at least an ester group and/or a sulfide group.

The linking group having two or more carbon atoms preferably is an alkylene group, an ester group, a sulfide group, an arylene group, an amide group, an urethane group, or a group consisting of a combination thereof.

Those groups may have a substituent without diverting the scope of the invention.

The polymerizable monomer (A) is exemplified by a compound represented by the formula (A1);

wherein Rf is a functional group comprising a fluorine-containing groups selected from a fluoroalkyl group and a fluoroalkylether group; A$^1$ represents a linking group; Y represents a polymerizable functional group, preferably (meth) acrylester group, epoxy group, or vinylether group; x represents an integer of 1 to 4, preferably 1 or 2; when x is 2 or more, each Y's are the same or different to each other.

A$^1$ is preferably a linking group comprising an alkylene group and/or an arylene group, and may comprise a linking group comprising a hetero atom. Examples of the linking group comprising a hetero atom include —O—, —C(=O)O—, —S—, —C(=O)—, and —NH—. Those groups may have a substituent without diverting the scope of the invention, however, those groups preferably don't have a substituent. A$^1$ preferably comprises 2 to 50 carbon atoms, more preferably 4 to 15 carbon atoms.

The polymerizable monomer (A) is preferably exemplified by a compound comprising a partial structure represented by the following formula (I). The composition employing a compound having such a partial structure has better patternability and better stability over time.

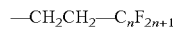 (I)

wherein n represents an integer of 1 to 8, preferably an integer 4 to 6.

Another preferable example of the polymerizable monomer (A) is a compound comprising a partial structure represented by the following formula (II). Of course, the polymerizable monomer (A) may have both of the partial structure represented by the formula (I) and a partial structure represented by the formula (II).

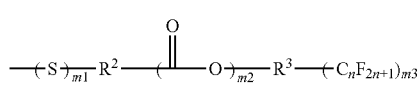

(II)

wherein $R^2$ and $R^3$ each represent an alkylene group having 1 to 8 carbon atoms, preferably an alkylene group having 1 to 4 carbon atoms. The alkylene group may have a substituent without deviating the scope of the invention.

m1 and m2 each represent 0 or 1, provided that at least one of m1 and m2 is 1. m3 represents an integer of 1 to 3, preferably 1 or 2. n represents an integer of 1 to 8, preferably an integer 4 to 6. When m3 is two or more, each —$C_nF_{2n+1}$'s may be the same or different to each other.

The polymerizable monomer (A) is preferably represented by the following formula (III);

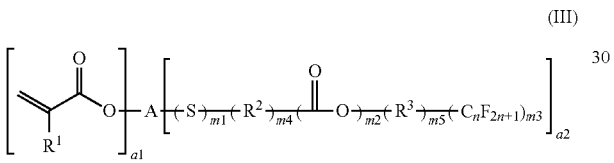

(III)

wherein $R^1$ represents a hydrogen atom, an alkyl group, a halogen atom, or a cyano group; A is a (a1+a2)-valent linking group; a1 represents an integer of 1 to 6; a2 represents an integer of 2 to 6; $R^2$ and $R^3$ are each an alkylene group having 1 to 8 carbon atoms; m1 and m2 each represents 0 or 1, provided that at least one of m1 and m2 is 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

$R^1$ represents a hydrogen atom, an alkylene group, a halogen atom, or a cyano group, preferably a hydrogen atom, or an alkyl group, more preferably a hydrogen atom, or a methyl group, further more preferably a hydrogen atom.

A is a (a1+a2)-valent linking group, preferably a linking group having an alkylene group and/or an arylene group, which may have a linking group comprising a hetero atom. Examples of the linking group having a hetero atom include —O—, —C(=O)O—, —S—, —C(=O)—, —NH—. Those groups may have a substituent, but preferably a group not having a substituent. A preferably has 2 to 50 carbon atoms, more preferably represents 4 to 15. $R^2$, $R^3$, m1, m2, m3 and n each are the same as those in the formula (II), and the preferable range thereof are the same as those in the formula (II).

a1 is an integer of 1 to 6, preferably 1 to 3, more preferably 1 or 2.

a2 is an integer of 2 to 6, preferably 2 or 3, more preferably 2.

When a1 is 2 or more, each A's may be the same or different to each other.

When a2 is 2 or more, each $R^2$'s, $R^3$'s, m1's, m2's, m3's, m4's, m5 and n each may be the same or different to each other.

The molecular weight of the polymerizable monomer (A) is preferably 500 to 2000, more preferably 600 to 1500, further more preferably 600 to 1200.

Specific examples of the polymerizable monomer (A) used in the curable composition of the invention are shown below, to which, however, the present invention should not be limited. In the following formula, $R^1$'s are each a hydrogen atom, an alkyl group, a halogen atom, or a cyano group.

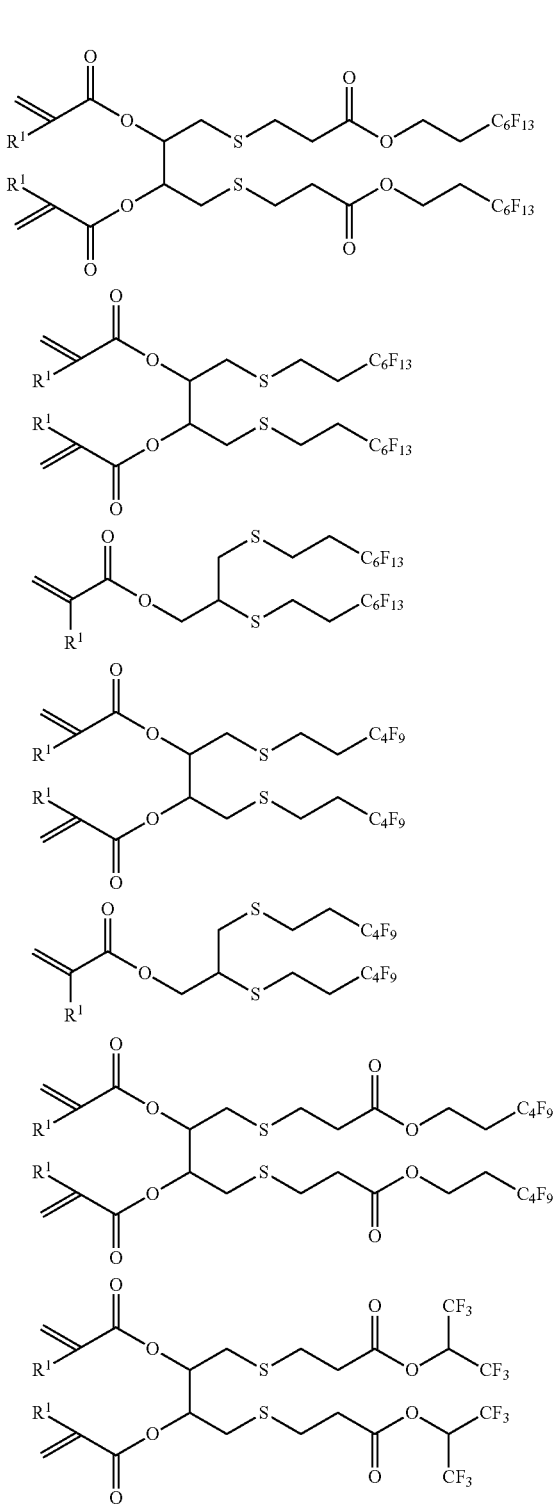

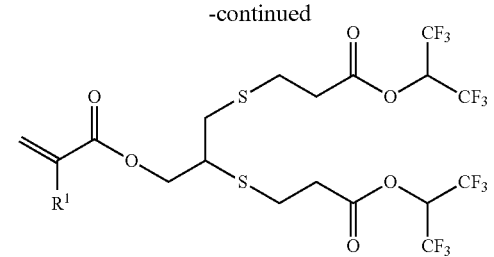
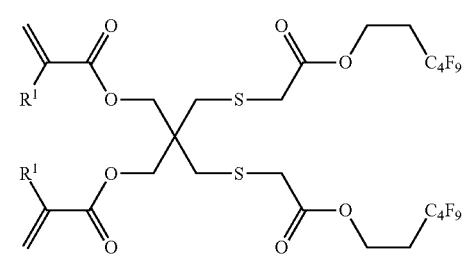
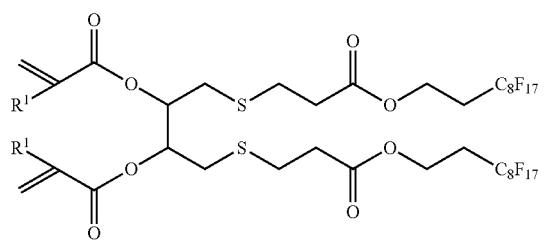
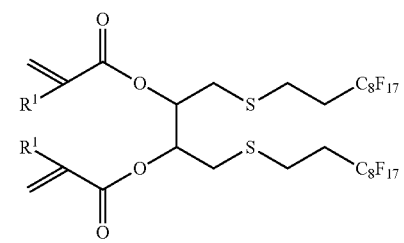
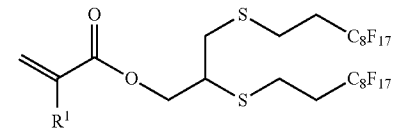
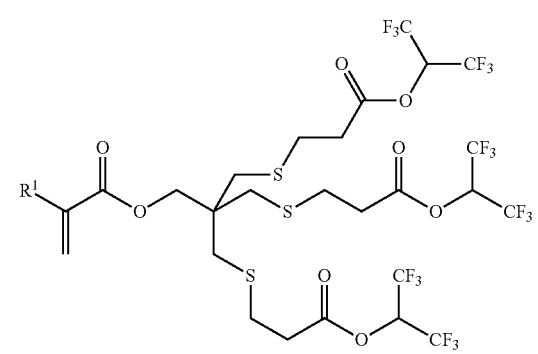
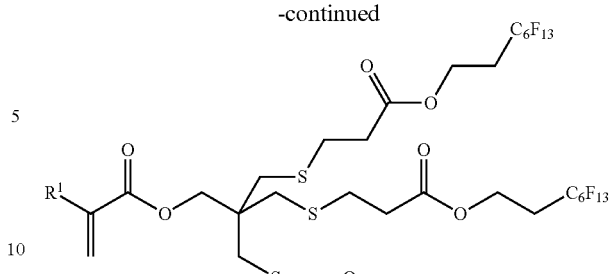
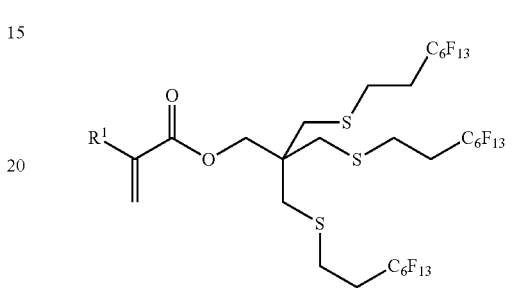
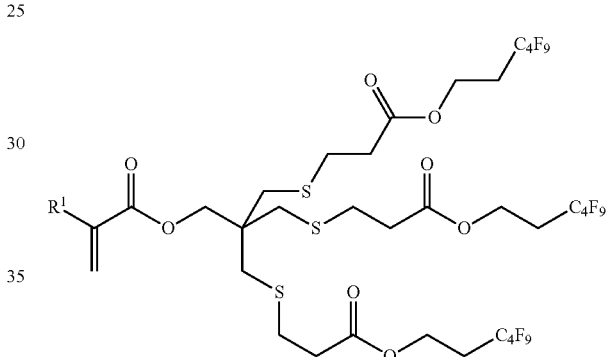
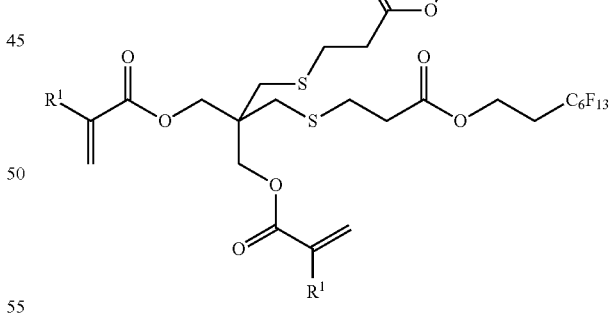
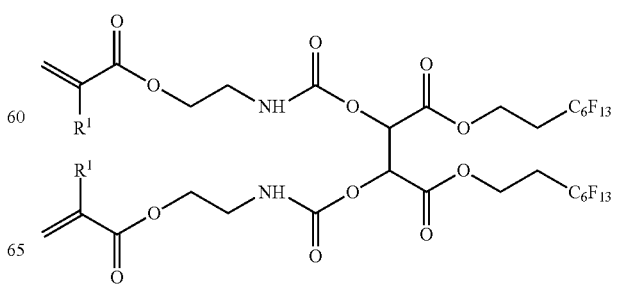

-continued

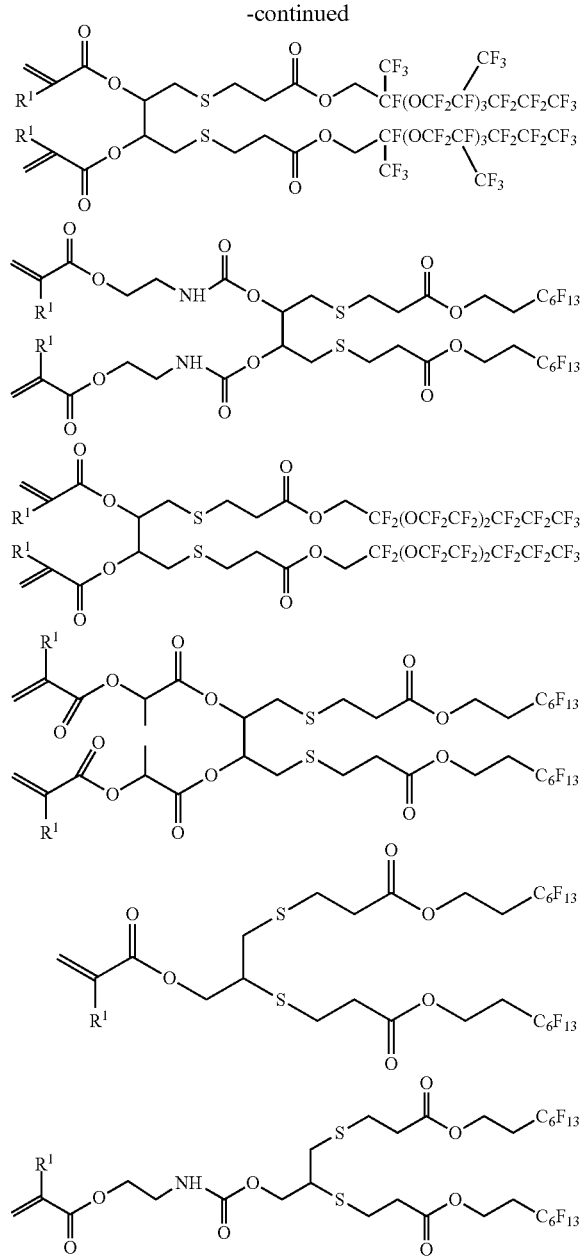

The content of the polymerizable monomer (A) in the curable composition of the invention is not specifically limited. However, the content of the polymerizable monomer (A) is preferably 0.1 to 100% by mass, more preferably 0.2 to 50% by mass, further more preferably 0.5 to 20% by mass, even more preferably 0.5 to 10% by mass, still more preferably 1 to 10% by mass.

—Other Polymerizable Monomer—

As described in the above, the curable composition for imprints of the invention may further contain any other polymerizable monomer different from the polymerizable monomer (A) for the purpose of suitably controlling the composition viscosity and of further enhancing the dry etching resistance, the imprint aptitude and the curability of the composition.

The other polymerizable monomer includes, for example, a polymerizable unsaturated monomer having from 1 to 6 ethylenic unsaturated bond-having groups, a compound having an oxirane ring (epoxy compound), a vinyl ether compound, a styrene derivative, a fluorine atom-having compound, propenyl ether, butenyl ether, etc. From the viewpoint of the curability of the composition, preferred is a polymerizable unsaturated monomer having from 1 to 6 ethylenic unsaturated bond-having groups.

The polymerizable unsaturated monomer having from 1 to 6 ethylenic unsaturated bond-having groups (mono- to hexafunctional polymerizable unsaturated monomer) is described below.

The polymerizable unsaturated monomer having one ethylenic unsaturated bond-having group (mono-functional polymerizable unsaturated monomer) includes concretely 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, 1- or 2-naphthyl(meth)acrylate, butanediol mono(meth)acrylate, butoxyethyl (meth)acrylate, butyl (meth)acrylate, cetyl (meth)acrylate, ethyleneoxide-modified (hereinafter this may be referred to as "EO") cresol (meth)acrylate, dipropylene glycol (meth)acrylate, ethoxylated phenyl (meth)acrylate, ethyl (meth)acrylate, isoamyl (meth)acrylate, isobutyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydiproylene glycol (meth)acrylate, methoxytripropylene glycol (meth)acrylate, methoxypolyethylene glycol (meth)acrylate, methoxytriethylene glycol (meth)acrylate, methyl (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromophenyl (meth)acrylate, EO-modified tribromophenyl (meth)acrylate, tridodecyl (meth)acrylate, p-isopropenylphenol, styrene, α-methylstyrene, acrylonitrile.

Of those, especially preferred for use in the invention are a mono-functional (meth)acrylate having an aromatic structure and/or alicyclic hydrocarbon structure in view of improving dry etching resistance, more preferably a mono-functional (meth)acrylate having an aromatic structure. Specific examples thereof include benzyl (meth)acrylate, 1- or 2-naphthylmethyl (meth)acrylate, dicyclopentanyl (meth)acrylate, dicyclopentanyloxyethyl (meth)acrylate, isobornyl (meth)acrylate, adamantyl (meth)acrylate. More preferred examples thereof include benzyl (meth)acrylate, 1- or 2-naphthyl(meth)acrylate, or 1- or 2-naphtylmethyl (meth)acrylate.

As the other polymerizable monomer, also preferred is a poly-functional polymerizable unsaturated monomer having two ethylenic unsaturated bond-containing groups.

Preferred examples of the di-functional polymerizable unsaturated monomer having two ethylenic unsaturated bond-containing groups for use in the invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea.

Of those, especially preferred for use in the invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, p- or m-xylylene di(meth)aclyate, etc.

Examples of the poly-functional polymerizable unsaturated monomer having at least three ethylenic unsaturated bond-having groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the invention are EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra(meth)acrylate, pentaerythritol tetra(meth)acrylate, etc.

Among the above-descried (meth)acrylates, acrylates are more preferable in view of hardness.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

Examples of the oxirane ring-having compound (epoxy compound) preferred for use in the invention include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols produced by adding one or more alkylene oxides to aliphatic polyalcohol such as ethylene glycol, propylene glycol, glycerin or the like; diglycidyl esters of aliphatic long-chain dibasic acids; monoglycidyl ethers of aliphatic higher alcohols; monoglycidyl ethers of polyether alcohols produced by adding alkyleneoxide to phenol, cresol, butylphenol or the like; glycidyl esters of higher fatty acids, etc.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are UVR-6216 (by Union Carbide), Glycidol, AOEX24, Cyclomer A200 (all by Daicel Chemical Industry), Epikote 828, Epikote 812, Epikote 1031, Epikote 872, Epikote CT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the other polymerizable monomer for use in the invention, vinyl ether compounds may be in the composition.

Any known vinyl ether compounds are usable, including, for example, 2-ethylhexyl vinyl ether, butanediol 1,4-divinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, etc.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable monomer for use in the invention, styrene derivatives may also be employed. The styrene derivatives include, for example, styrene, p-methylstyrene, p-methoxystyrene, β-methylstyrene, p-methyl-β-methylstyrene, α-methylstyrene, p-methoxy-β-methylstyrene, p-hydroxystyrene, etc.

For the purpose of enhancing the releasability from mold and the coatability of the composition, a fluorine atom-having compound may be incorporated into the composition. The compound includes, for example, trifluoromethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, etc.

As the other polymerizable monomer for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, propenyl ether propylene carbonate, etc.

The preferred content of the other polymerizable monomer mentioned in the above varies depending on the content of the specific polymerizable monomer (A) for use in the invention. For example, the content of the other polymerizable monomer in the composition of the invention is preferably from 0 to 99.9% by mass of all the polymerizable monomers constituting the composition, more preferably from 50 to 99.8% by mass, even more preferably from 80 to 99.5% by mass.

Preferred blend embodiments of the polymerizable monomer (A) and the other polymerizable monomer in the invention are described below.

A mono-functional polymerizable unsaturated monomer is generally used as a reactive diluent, and this has an effect of lowering the viscosity of the curable composition for imprints of the invention; and preferably, its amount in the composition is at least 15% by mass of the total amount of the polymerizable monomers, more preferably from 20 to 90% by mass, even more preferably from 25 to 85% by mass, still more preferably from 30 to 80% by mass.

A monomer having two polymerizable groups (di-functional polymerizable monomer) is added to the composition preferably in an amount of at most 90% by mass of all the polymerizable unsaturated monomers, more preferably at most 80% by mass, even more preferably at most 70% by mass.

The proportion of the mono-functional and di-functional polymerizable unsaturated monomers is preferably from 10 to 100% by mass of all the polymerizable unsaturated monomers, more preferably from 30 to 100% by mass, even more preferably from 50 to 90% by mass.

The proportion of the poly-functional polymerizable unsaturated monomer having 3 or more unsaturated bond-having groups in the composition is preferably at most 80% by mass of all the polymerizable unsaturated monomers, more preferably at most 60% by mass, even more preferably at most 40% by mass. When the proportion of the poly-functional polymerizable unsaturated monomer having 3 or more unsaturated bond-having groups is at most 80% by mass, it is favorable since the viscosity of the composition may be lowered.

(Photopolymerization Initiator)

The curable composition for imprints of the invention contains a photopolymerization initiator. As the photopolymerization initiator in the invention, usable is any compound capable of generating an active radical for polymerization of the above-mentioned polymerizable monomer through photoirradiation. As the photopolymerization initiator, preferred is a radical polymerization initiator. In the invention, two or more different types of photopolymerization initiators may be used, as combined.

The content of the photopolymerization initiator to be in all of the component except for solvents in the composition of the invention may be, for example, from 0.01 to 15% by mass of all the polymerizable monomers constituting the composition, preferably from 0.1 to 12% by mass, more preferably from 0.2 to 7% by mass. In case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better. Heretofore, inkjet compositions and compositions for liquid-crystal display color filters containing dye and/or pigments have been variously investigated in point of the preferred amount of the photopolymerization initiator and/or the photoacid generator to be in the compositions; however, there is no report relating to the preferred amount of the photopolymerization initiator and/or the photoacid generator to be added to photocurable compositions for imprints. In this connection, in the systems containing dye and/or pigment, the dye and/or the pigment may act as a radical-trapping agent and may have some influence on the photopolymerization and the sensitivity of the compositions. Taking this into consideration, the amount of the photopolymerization initiator to be added to these applications is optimized. On the other hand, in the curable composition for imprints of the invention, dye and/or pigment are not indispensable ingredients, and the optimum range of the photopolymerization initiator in the composition may differ from that in the field of inkjet compositions and compositions for liquid-crystal display color filters.

As the radical photopolymerization initiator for use in the invention, preferred are acylphosphine oxide compounds and oxime ester compounds from the viewpoint of the curing sensitivity and the absorption characteristics of the composition. As the photopolymerization initiator, for example, commercial products may be used. Their examples include those described in JP-A-2008-105414, [0091].

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

(Other Ingredients)

In addition to the above-mentioned polymerizable monomer and the photopolymerization initiator, the curable composition for imprints of the invention may contain any other ingredients such as surfactant, antioxidant, solvent, polymer, pigment, dye and others for various purposes not detracting from the effect of the invention. Preferably, the curable composition for imprints of the invention contain at least one selected from surfactant, and antioxidant.

—Surfactant—

Preferably, the curable composition for imprints of the invention contains a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferably, the composition contains at least one of a fluorine-containing surfactant, a silicone-type surfactant, a fluorine-containing silicone-type surfactant, more preferably contains both of a fluorine-containing surfactant and a silicone-type surfactant, or contains a fluorine-containing silicone-type surfactant, most preferably contains a fluorine-containing silicone-type surfactant. The fluorine-containing surfactant and the silicone-type surfactant are preferably nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the curable composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); FutagentFT250, FT251, DFX18 (Neos' trade names); Unidyne DS-401, DS-403, DS-451 (Daikin's trade names); Megafac 171, 172, 173, 178K, 178A (Dai-Nippon Ink's trade names).

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

—Antioxidant—

Preferably, the curable composition for imprints of the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab A070, A080, A0503 (by Adeka), etc. These may be used either singly or as combined.

—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount.

Examples of the polymerization initiator used for the invention include hydroquinone, p-methoxyphenol, di-t-butyl-p-cresol, pyrogallol, t-butylcatecol, benzoquinone, 4,4'-thiobis(3-methyl-6-t-butylphenol), 2,2'-methylenebis(4-methyl-6-t-butylphenol), Cerium(III) N-nitrosophenylhydroxyamine, phenothiazine, phenoxazine, 4-methoxynaphtol, 2,2,6,6-tetramethylpiperidine-1-oxy-free-radical, 2,2,6,6-tetramethylpiperidine, 4-hydroxy-2,2,6,6-tetramethylpiperidine-1-oxy-free-radical, and nitrobenzene, and dimethylaniline.

—Solvent—

A solvent may be used for the curable composition for imprints of the invention, in accordance with various needs. In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition of the invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition, more preferably from 0 to 97% by mass. In forming a patter having a thickness of at most 500 nm, the solvent content is preferably from 20 to 99% by mass, more preferably from 40 to 99% by mass, even more preferably from 70 to 98% by mass.

—Polymer Ingredient—

The composition of the invention may contain a poly-functional oligomer having a larger molecular weight than that of the above-mentioned, other poly-functional monomer within a range capable of attaining the object of the invention, for the purpose of further increasing the crosslinking density of the composition. Examples of the photoradical-polymerizable poly-functional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

In addition to the above-mentioned ingredients, the curable composition for imprints of the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for imprints of the invention can be produced by mixing the above-mentioned ingredients. The ingredients may be mixed and dissolved to prepare the curable composition, generally at a temperature falling within a range of from 0° C. to 100° C. After the ingredients are mixed, the resulting mixture may be filtered through a filter having a pore size of from 0.003 μm to 5.0 μm to give a solution. The filtration may be effected in plural stages, or may be repeated plural times. The solution once filtered may be again filtered. Not specifically defined, the material of the filter may be any one, for example, polyethylene resin, polypropylene resin, fluororesin, nylon resin, etc.

The viscosity of the curable composition of the invention, except the solvent therein, at 25° C. is at most 100 mPa·s, more preferably from 1 to 70 mPa·s, even more preferably from 2 to 50 mPa·s, still more preferably from 3 to 30 mPa·s.

[Patterning Method]

The patterning method (especially micropatterning method) of using the curable composition for imprints of the invention is described below. The patterning method of the invention comprises applying the curable composition for imprints of the invention onto a substrate or a support (base) to form a patterning layer thereon; pressing a mold against the surface of the patterning layer; and irradiating the patterning layer with light, thereby curing the composition of the invention to form a micropattern.

Preferably, the curable composition for imprints of the invention is, after irradiated with light, further heated and cured. Concretely, at least the composition of the invention is applied onto a substrate (base or support) and optionally dried to form a layer comprising the composition of the invention (patterning layer), thereby preparing a pattern acceptor (having the patterning layer formed on the substrate), then a mold is pressed against the surface of the patterning layer of the pattern acceptor to thereby transfer the mold pattern onto the pattern acceptor, and the resulting micropatterned layer is cured through photoirradiation. The photoimprint lithography of the patterning method of the invention may enable lamination and multi-layer patterning, and therefore may be combined with ordinary imprint technology.

The curable composition for imprints of the invention may form a finer micropattern through photoimprint lithography, at low cost and with high accuracy. Accordingly, the composition of the invention can form micropatterns heretofore formed according to conventional lithography at low cost and with high accuracy. For example, when the composition of the invention is applied onto a substrate and the composition layer is exposed to light, cured and optionally dried (baked), then permanent films of overcoat layers or insulating films for use in liquid-crystal displays (LCD) may be formed and the formed films may be used as an etching resist in producing semiconductor integrated circuits, recording materials or flat panel displays. In particular, the patterns formed of the curable composition for imprints of the invention are excellent in etching aptitude, and can therefore be used as etching resists in dry etching with fluorocarbon, etc.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1000 ppm, more preferably at most 10 ppm, even more preferably at most 100 ppb.

The patterning method (pattern transferring method) with the curable composition for imprints of the invention is described concretely hereinunder.

In the patterning method of the invention, the composition of the invention is first applied onto a support to form a patterning layer thereon.

The coating method for applying the curable composition for imprints of the invention onto a substrate may be a well known coating method of, for example, a dip coating method, an air knife coating method, a curtain coating method, a wire bar coating method, a gravure coating method, an extrusion coating method, a spin coating method, a slit scanning method, an inkjet method, etc. The thickness of the patterning method of the composition of the invention may vary depending on the use thereof, and may be from 0.03 μm to 30 μm or so. In the case where droplets are applied on a substrate by an inkjet method, the amount of the droplets is preferably 1 pl to 20 pl. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched, and the adhesiveness of the patterning layer to the substrate may be enhanced. The pattern to be formed of the composition of the invention may have good adhesiveness to the organic layer, if any, formed on the substrate.

The substrate (base or support) to which the curable composition for imprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate may be light-transmissive or non-light-transmissive, depending on the combination thereof with a mold.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

The mold material usable in the invention is described. IN the photoimprint lithography with the composition of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the invention, preferably, the photoirradiation is attained while the mold is kept in contact with the patterning layer.

The mold usable in the invention has a transferable pattern formed thereon. The pattern of the mold may be formed, for example, through photolithography, electronic beam lithography or the like by which a pattern may be formed to a desired processing accuracy. In the invention, however, the mold patterning method is not specifically defined.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprint of the invention from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the composition of the invention, in general, the mold pressure in the patterning method of the invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the photoimprint lithography applied to the invention, the substrate temperature in photoirradiation may be room temperature; however, the photoirradiation may be attained under heat for enhancing the reactivity. In the previous stage of photoirradiation, preferably, the system is kept in vacuum as effective for preventing contamination with bubbles or contamination with oxygen or for preventing the reduction in reactivity, and as effective for enhancing the adhesiveness of the curable composition for imprints with mold. The system may be subjected to photoirradiation while still kept in vacuum. In the patterning method of the invention, the vacuum degree in photoirradiation is preferably from $10^{-1}$ Pa to ordinary pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as $\gamma$ rays, X rays, $\alpha$ rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

The pattern thus formed according to the patterning method of the invention as described in the above can be used as a permanent film (resist for structural members) for use in liquid-crystal displays (LCD) and others, or as an etching resist. After its production, the composition of the invention may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

The pattern formed according to the patterning method of the invention is useful as an etching resist. In case where the composition for imprints of the invention is used as an etching resist, a nano-order micropattern is first formed on a substrate such as a silicon wafer with a thin film of SiO$_2$ or the like formed thereon, according to the patterning method of the invention. Next, this is etched with hydrogen fluoride in wet etching, or with CF$_4$ in dry etching, thereby forming a desired pattern on the substrate. The curable composition for imprints of the invention exhibits especially good etching resistance in dry etching.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

Synthetic Example 1

Synthesize of Polymerizable monomer Ax-1

45 ml of ethanol and 5 ml of water were dissolved in 2 g of dithioerythritol, and then, 1.1 g of sodium hydroxide was added and stirred for 30 minutes at room temperature. To this, 15.4 g of perfluorohexylethyliodine was added and reacted at 90° C. for 7 hours. To the reaction liquid, ethyl acetate was added, and then, the organic phase was wished with water and saturated saline in that order, and dried and condensed to obtain (Ax-1a).

6.7 g of (Ax-1a) was dissolved into 80 ml of acetone, and then, 3.2 g of triethylamine was added. To this, 2.5 g of acryloyl chloride was dropped in ice-cold. After the drop, the reaction was carried out at room temperature for 20 hours, and then, 50 ml of water was added to the reaction liquid. This was extracted with acetic ether. The organic phase was washed with 1N-aqueous solution of hydrochloric acid, saturated aqueous solution of sodium hydrogen carbonate, and saturated saline and dried and condensed to obtain crude product. This was purified using column chromatography to obtain 2.8 g of polymerizable monomer (Ax-1). $^1$H-NMR (CDCl$_3$): δ2.2-2.5 (m, 4H), δ 2.7-3.0 (m, 8H), δ 5.4 (m, 2H), δ 5.95 (d, 2H), δ 6.1 (dd, 2H), δ 6.45 (d, 2H)

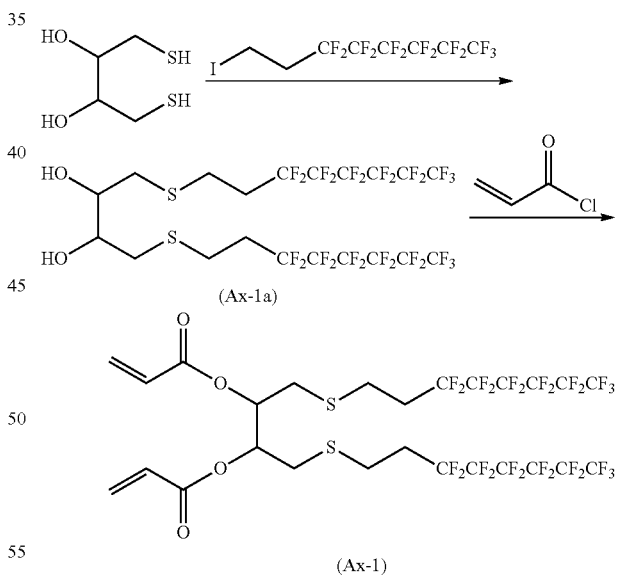

Synthetic Example 2

Synthesize of Polymerizable monomer Ax-2

2 g of dithioerythritol was dissolved in 20 ml of ethyl acetate. To this, 0.2 g of triethylamine and 11.4 g of perfluorohexylethylacrylate were added and reacted at room temperature for 4 hours. To this, 4.0 g of trimethylamine and 20 ml of ethyl acetate were added, and then, 2.9 g of acryloyl chloride was dropped in ice-cold. After the drop, the reaction was carried out at room temperature for 20 hours, and then, 50 ml of water was added to the reaction liquid. The organic phase was washed with 1N-aqueous solution of hydrochloric acid, saturated aqueous solution of sodium hydrogen carbonate, and saturated saline, and then, dried and condensed to obtain crude product. This was purified using column chromatography to obtain 3.0 g of polymerizable monomer (Ax-2).

$^1$H-NMR (CDCl$_3$): δ 2.4-3.0 (m, 16H), δ 4.4 (t, 4H), δ 5.4 (m, 2H), δ 5.9 (d, 2H) δ 6.1 (dd, 2H), δ 6.45 (d, 2H)

Synthetic Example 3

Polymerizable monomers (Ax-3) to (Ax-9) were synthesized according a similar method to Synthetic Example 1 or Synthetic Example 2.

$^1$H-NMR (CDCl$_3$)

(Ax-3)

δ2.3-2.6 (m, 4H), δ 2.8-3.0 (m, 6H), δ3.1 (m, 1H), δ4.4 (m, 2H), δ5.9 (d, 2H), δ6.1 (dd, 2H), δ6.45 (d, 2H)

(Ax-4)

δ 2.2-2.6 (m, 4H), δ2.7-3.0 (m, 8H), δ5.4 (m, 2H), δ5.95 (d, 2H), δ 6.1 (dd, 2H), δ6.45 (d, 2H)

(Ax-5)

δ 2.8-3.0 (m, 12H), δ5.4 (m, 2H), δ5.8 (m, 2H), δ5.9 (d, 2H), δ6.1 (dd, 2H), δ 6.45 (d, 2H)

(Ax-6)

δ2.8-3.0 (m, 12H), δ3.1 (m, 1H), δ4.4 (m, 2H), δ5.8 (m, 2H), δ5.9 (d, 1H), δ 6.1 (dd, 1H), δ6.45 (d, 1H)

(Ax-7)

δ 2.3-2.6 (m, 4H), δ2.8-3.0 (m, 6H), δ3.1 (m, 1H), δ4.4 (m, 2H), δ5.9 (d, 2H), δ 6.1 (dd, 2H), δ6.45 (d, 2H)

(Ax-8)

δ 2.4-3.0 (m, 16H), δ4.4 (t, 4H), δ5.4 (m, 2H), δ5.9 (d, 2H), δ6.1 (dd, 2H), δ 6.45 (d, 2H)

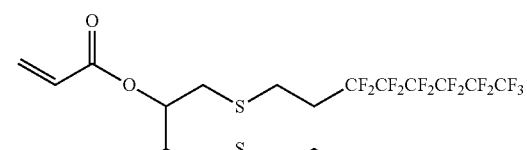

(Ax-1)

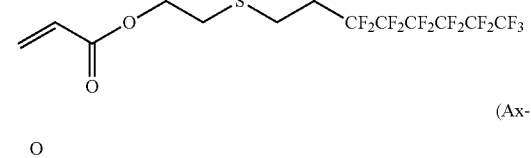

(Ax-2)

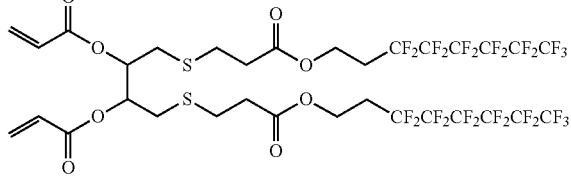

(Ax-3)

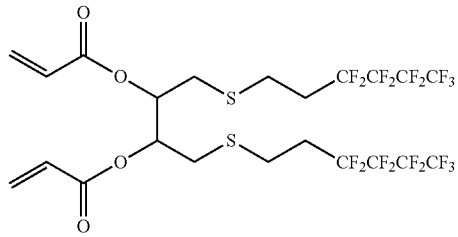

(Ax-4)

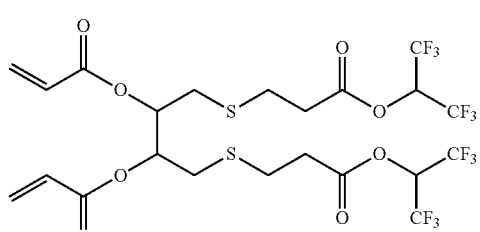

(Ax-5)

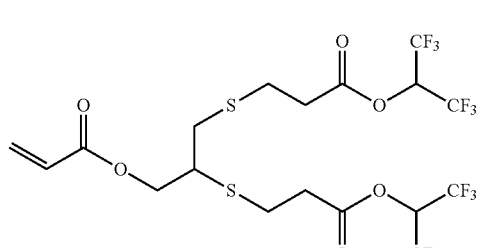

(Ax-6)

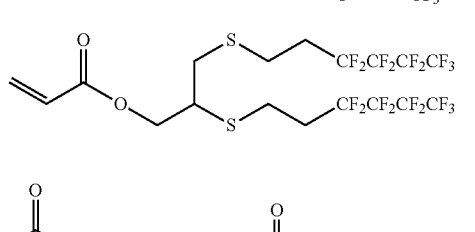

(Ax-7)

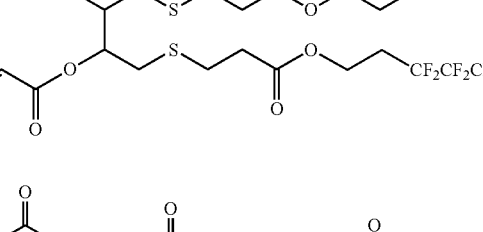

(Ax-8)

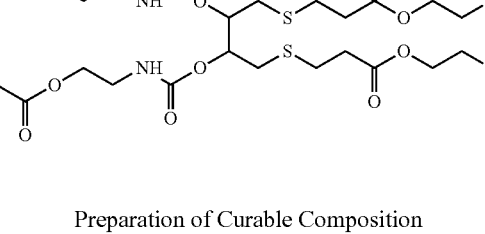

(Ax-9)

Preparation of Curable Composition

Example

To the polymerizable monomer shown in Table 1 below, the following polymerization initiator P-1 (2% by mass), the following surfactant W-1 (0.1% by mass), the following surfactant W-2 (0.04% by mass), the following antioxidant A-1 (1% by mass) and the following antioxidant A-2 (1% by mass) were added. In addition, as a polymerization inhibitor, 4-methoxyphenol was added so that the content of 4-methoxyphenol relative to the polymerizable monomers could be 200 ppm. This was filtered through a filter made of tetrafluoroethylene having a pore size of 0.1 μm, to prepare the curable composition. In Table 1, the amount to be added was shown by weight part.

TABLE 1

|  | (A)Polymerizable Monomer | Other Polymerizable Monomer | | |
| --- | --- | --- | --- | --- |
| Example 1 | Ax-1(5) | R-2(45) | R-4(50) | |
| Example 2 | Ax-2(5) | R-2(45) | R-4(50) | |
| Example 3 | Ax-3(5) | R-2(45) | R-4(50) | |
| Example 4 | Ax-4(5) | R-2(45) | R-4(50) | |
| Example 5 | Ax-5(5) | R-2(45) | R-4(50) | |
| Example 6 | Ax-6(5) | R-2(45) | R-4(50) | |
| Example 7 | Ax-7(5) | R-2(45) | R-4(50) | |
| Example 8 | Ax-1(1) | R-2(49) | R-4(50) | |
| Example 9 | Ax-1(10) | R-2(40) | R-4(50) | |
| Example 10 | Ax-1(5) | R-5(45) | R-3(50) | |
| Example 11 | Ax-1(5) | R-1(25) | R-3(50) | R-6(20) |
| Example 12 | Ax-8(3) | R-2(47) | R-4(50) | |
| Example 13 | Ax-9(1) | R-2(49) | R-4(50) | |
| Example 14 | Ax-2(0.5) | R-2(49.5) | R-4(50) | |
| Comparative Example 1 | none | R-2(50) | R-4(50) | |
| Comparative Example 2 | X-1(5) | R-2(45) | R-4(50) | |
| Comparative Example 3 | X-2(5) | R-2(45) | R-4(50) | |
| Comparative Example 4 | X-3(5) | R-2(45) | R-4(50) | |
| Comparative Example 5 | X-4(5) | R-2(45) | R-4(50) | |
| Comparative Example 6 | X-5(5) | R-2(45) | R-4(50) | |

Compounds for Comparative Examples

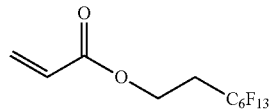
(X-1)

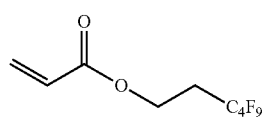
(X-2)

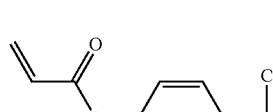
(X-3)

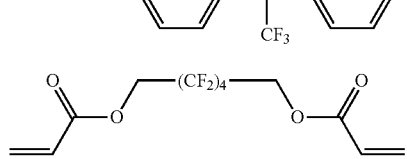
(X-4)

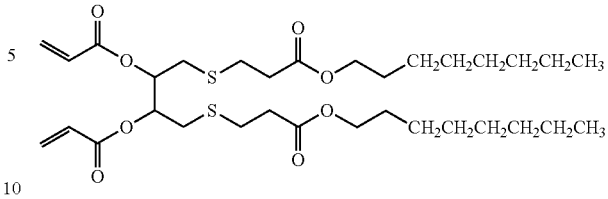
(X-5)

<Other Polymerizable Monomer>
R-1: benzyl acrylate (Biscoat 160, manufactured by Osaka Organic Chemical)
R-2: 2-naphtylmethyl acrylate (it was synthesized by a conventional method from 2-bromomethyl naphthalene and acryl acid.)
R-3: neopentyl glycol diacrylate (Kayarad, NPGDA manufactured by Nippon Kayaku)
R-4: m-xylylene diacrylate (it was synthesized by a conventional method from α,α'-dicluoro-m-xylene and acryl acid)
R-5: 2-ethylhexyl acrylate (manufactured by Aldrich)
R-6: isobonyl acrylate (IBXA, manufactured by Osaka Organic Chemical)

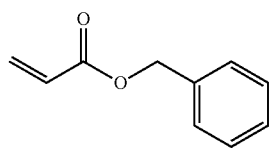
R-1

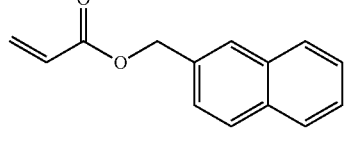
R-2

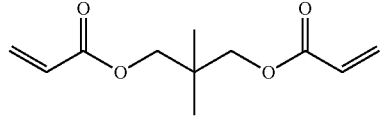
R-3

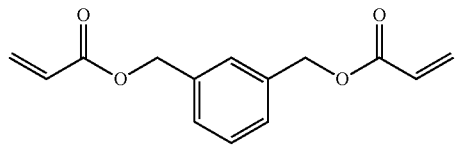
R-4

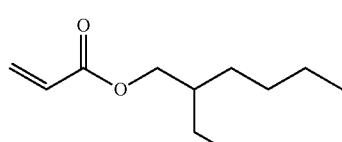
R-5

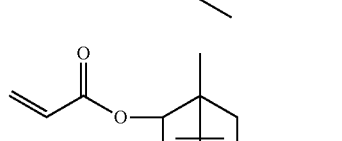
R-6

<Polymerization Initiator>
P-1: 2,4,6-trimethylbenzoyl-ethoxyphenyl-phosphineoxide (Lucirin TPO-L: manufactured by BASF Corporation)

<Surfactants>
W-1: fluorine-containing surfactant (manufactured by Tochem Products).
W-2: silicone-type surfactant (Megafac Paintad 31: manufactured by Dai-Nippon Ink).
<Antioxidants>
A-1: Sumilizer GA80 (manufactured by Sumitomo Chemical).
A-2: Adekastab A0503 (manufactured by Adeka).
(Evaluation)
The obtained compositions in Examples and Comparative Examples were evaluated as follows. The results are shown in Table 2 below.
<Photo Curability of the Curable Compositions>
The curable composition as prepared above was coated on a Si wafer, and then, not pressed against a mold, this was exposed to light in a nitrogen atmosphere at a dose of 240 mJ/cm$^2$. Each obtained exposed films were tack free. It was found that good cured films were obtained.
<Evaluation of Patternability>
Each composition was coated on a silicon substrate in a mode of spin coating. A mold of quartz having rectangular line/space pattern (1/1) with a line width of 40 nm and a groove depth of 60 nm, of which the surface had been processed with silane coupling agent comprising perfluoropolyethers structure, was put on the obtained coating film, and set in a nanoimprinting device. The device was degassed in vacuum, and then nitrogen was introduced to the device by conducting the nitrogen purging. The mold was pressed against the substrate under a pressure of 0.2 Mpa, at 25° C., and then this was exposed to light under a condition of 240 mJ/cm$^2$ from the back of the mold, and after the expose, the mold was released to give a pattern. The obtained pattern profile was observed by a scanning electron microscope to evaluate as follows.
A: a rectangular pattern which is faithful to the mold was obtained.
B: a pattern in which the top of the pattern was rounded was obtained.
C: a pattern in which the top of the pattern was rounded and the height of the pattern is less than the groove depth of the mold was obtained.
<Mold Releasability>
20 sheets of coating films obtained by applying the curable composition as prepared above on a silicon substrate by a spin coating method were prepared per sample.
A mold of quartz having rectangular line/space pattern (1/1) with a line width of 40 nm and a groove depth of 60 nm, of which the surface had been processed with silane coupling agent comprising perfluoropolyethers structure, was put on the obtained coating film, and set in a nanoimprinting device. The device was degassed in vacuum, and then nitrogen was introduced to the device by conducting the nitrogen purging. The mold was pressed against the substrate under a pressure of 0.5 Mpa, at 25° C., and then this was exposed to light under a condition of 240 mJ/cm$^2$ from the back of the mold, and after the expose, the mold was released to give a pattern.
Using the same mold, pattern transfer to 20 sheets of the coated films was carried out. The pattern which was obtained after 20 times pattern transfer was observed by a scanning electron microscope. In addition, the composition which was adhered to the mold used for the formation of the pattern was observed by a scanning electron microscope and by a light microscope, to evaluate the releasability.
A: no curable composition remained at all on the mold.
B: only a little curable composition remained on the mold
C: obvious curable composition remained on the mold.
D: curable composition was adhered to the mold, and thus, 20 times of pattern transfer could not be normally carried out.
<Line Edge Roughness>
The substrate to which the pattern was adhered, which was obtained in the evaluation of patternability, was subjected to dry etching with plasma of a gas of Ar/C$_4$F$_8$/O$_2$=100:4:2 using a dry etcher (U-621) manufactured by Hitachi High-Technology to remove the residual film. The length-direction edges of the line pattern of the obtained pattern in an area of 5 μm were examined with a length-measuring SEM (Hitachi, Ltd., S-8840) to measure the distance from the standard line where each edge was to be present. This measurement was made on 50 points, a standard deviation was determined, and 3σ was calculated. A smaller value thereof indicates a better line edge roughness.

TABLE 2

| | Patternability | Stain of Mold | Life Edge Roughness after Dry-etching (nm) |
|---|---|---|---|
| Example 1 | A | A | 3.0 |
| Example 2 | A | A | 3.1 |
| Example 3 | A | B | 2.8 |
| Example 4 | A | A | 3.8 |
| Example 5 | B | B | 3.5 |
| Example 6 | B | B | 3.5 |
| Example 7 | A | B | 3.8 |
| Example 8 | A | A | 3.0 |
| Example 9 | A | A | 3.0 |
| Example 10 | A | A | 4.2 |
| Example 11 | A | A | 4.0 |
| Example 12 | A | A | 3.0 |
| Example 13 | A | A | 3.1 |
| Example 14 | A | A | 3.3 |
| Comparative Example 1 | C | D | 10.5 |
| Comparative Example 2 | B | C | 6.7 |
| Comparative Example 3 | C | C | 7.8 |
| Comparative Example 4 | C | D | 9.9 |
| Comparative Example 5 | C | C | 8.0 |
| Comparative Example 6 | C | D | 10.8 |

Examples 1 to 11, in which the polymerizable compositions of the invention were used, were excellent in the patternability after the pattern transfer is repeated while the mold was not stained. Examples 1 to 11 were also excellent in the line edge roughness after the dry-etching. On the other hand, Comparative Examples 1 to 6 were poor in all of the patternability, the stain of mold and the line edge roughness after the dry-etching.

The present disclosure relates to the subject matter contained in Japanese Patent Application No. 055535/2009 filed on Mar. 9, 2009, and Japanese Patent Application No. 039260/2010 filed on Feb. 24, 2010, which are expressly incorporated herein by reference in their entirety. All the publications referred to in the present specification are also expressly incorporated herein by reference in their entirety.

The foregoing description of preferred embodiments of the present invention has been presented for purposes of illustration and description, and is not intended to be exhaustive or to limit the present invention to the precise form disclosed. The description was selected to best explain the principles of the present invention and their practical application to enable others skilled in the art to best utilize the present invention in various embodiments and various modifications as are suited to the particular use contemplated. It is intended that the scope of the present invention not be limited by the specification, but be defined claims set forth below.

The invention claimed is:

1. A curable composition for imprints comprising at least one polymerizable monomer (A) and at least one photopolymerization initiator (B), wherein the polymerizable monomer (A) comprises at least two of fluorine-containing groups selected from a fluoroalkyl group and a fluoroalkylether group, each of two of the fluorine-containing groups is connected with each other through a linking group having at least two carbon atoms, the linking group comprises a sulfide bond, and the polymerizable monomer (A) comprises at least two polymerizable groups.

2. The curable composition for imprints according to claim 1, wherein at least one of the fluorine-containing groups connected with each other through a linking group having at least two carbon atoms is a fluoroalkyl group having at least two carbon atoms.

3. The curable composition for imprints according to claim 1, wherein at least one of the fluorine-containing groups connected with each other through a linking group having at least two carbon atoms is a fluoroalkyl group having at least four carbon atoms.

4. The curable composition for imprints according to claim 1, wherein at least one of the fluorine-containing groups connected with each other through a linking group having at least two carbon atoms comprises a trifluoromethyl group.

5. The curable composition for imprints according to claim 1, wherein the polymerizable monomer (A) is represented by the following formula (A1):

wherein Rf is a functional group comprising a fluorine-containing group selected from a fluoroalkyl group and a fluoroalkylether group; $A^1$ represents a linking group comprising a sulfide bond; Y represents a polymerizable functional group; and x represents an integer of 2 to 4.

6. The curable composition for imprints according to claim 1, wherein the polymerizable monomer (A) is a (meth)acrylate.

7. The curable composition for imprints according to claim 1, which further comprises a polymerizable monomer other than the polymerizable monomer (A).

8. The curable composition for imprints according to claim 7, wherein the polymerizable monomer other than the polymerizable monomer (A) is a (meth)acrylate monomer comprising an aromatic structure and/or an alicyclic hydrocarbon structure.

9. The curable composition for imprints according to claim 1, wherein the content of a compound having a molecular weight of 2000 or more is at most 30% by mass, relative to the total amount of all polymerizable monomers in the curable composition for imprints.

10. The curable composition for imprints according to claim 1, which further comprises at least one of a surfactant and an antioxidant.

11. The curable composition for imprints according to claim 1, wherein the polymerizable monomer (A) comprises a partial structure represented by the following formula (I):

wherein n represents an integer of 1 to 8.

12. The curable composition for imprints according to claim 1, wherein the polymerizable monomer (A) comprises a partial structure represented by the following formula (II):

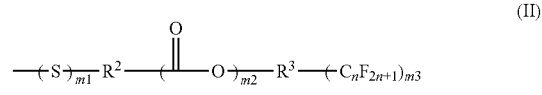

wherein $R^2$ and $R^3$ each represent an alkylene group having 1 to 8 carbon atoms; m1 represents 1; m2 represents 0 or 1; m3 represents an integer of 1 to 3; and n represents an integer of 1 to 8.

13. The curable composition for imprints according to claim 1, wherein the polymerizable monomer (A) is represented by the following formula (III):

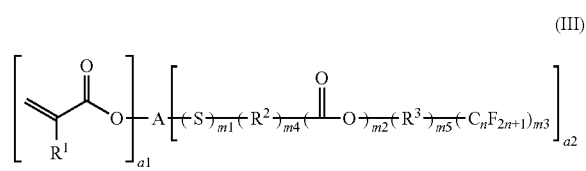

wherein $R^1$ represents a hydrogen atom, an alkyl group, a halogen atom, or a cyano group; A is a (a1+a2)-valent linking group; a1 represents an integer of 2 to 6; a2 represents an integer of 2 to 6; $R^2$ and $R^3$ are each an alkylene group having 1 to 8 carbon atoms; m1 represents 1; m2 represents 0 or 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

14. A patterning method, comprising applying the curable composition for imprints according to claim 1 onto a substrate to form a patterning layer thereon, pressing a mold against a surface of the patterning layer, and irradiating the patterning layer with light.

15. A pattern obtained according to the patterning method according to claim 14.

16. A polymerizable monomer represented by the following formula (III):

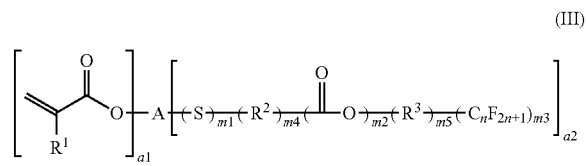

wherein $R^1$ represents a hydrogen atom, an alkyl group, a halogen atom, or a cyano group; A is a (a1+a2)-valent linking group; a1 represents an integer of 2 to 6; a2 represents an integer of 2 to 6; $R^2$ and $R^3$ are each an alkylene group having 1 to 8 carbon atoms; m1 represents 1; m2 represents 0 or 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

17. A polymerizable composition comprising a polymerizable monomer represented by the following formula (III):

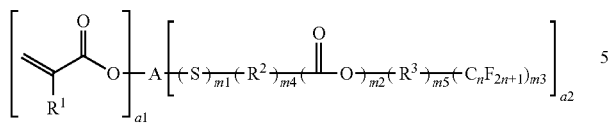

(III)

wherein $R^1$ represents a hydrogen atom, an alkyl group, a halogen atom, or a cyano group; A is a (a1+a2)-valent linking group; a1 represents an integer of 2 to 6; a2 represents an integer of 2 to 6; $R^2$ and $R^3$ are each an alkylene group having 1 to 8 carbon atoms; m1 represents 1; m2 represents 0 or 1; m3 represents an integer of 1 to 3; m4 and m5 each represent 0 or 1, provided that at least one of m4 and m5 is 1; when both of m1 and m2 are 1, m4 is 1; and n is an integer of 1 to 8.

* * * * *